(12) United States Patent
Park et al.

(10) Patent No.: US 12,476,614 B2
(45) Date of Patent: Nov. 18, 2025

(54) ACOUSTIC WAVE FILTER (71) Applicant: SAMSUNG ELECTRO-MECHANICS CO., LTD., Suwon-si (KR)

(72) Inventors: Chanhee Park, Suwon-si (KR); Sangheon Han, Suwon-si (KR)

(73) Assignee: Samsung Electro-Mechanics Co., Ltd., Suwon-si (KR)

(*) Notice: Subject to any disclaimer, the term of this patent is extended or adjusted under 35 U.S.C. 154(b) by 127 days.

(21) Appl. No.: 18/396,029

(22) Filed: Dec. 26, 2023

(65) Prior Publication Data
US 2024/0348232 A1 Oct. 17, 2024

(30) Foreign Application Priority Data
Apr. 11, 2023 (KR) .................. 10-2023-0047622

(51) Int. Cl.
H03H 9/56 (2006.01)
H03H 9/13 (2006.01)
H03H 9/60 (2006.01)

(52) U.S. Cl.
CPC ............ H03H 9/568 (2013.01); H03H 9/133 (2013.01); H03H 9/605 (2013.01)

(58) Field of Classification Search
CPC ......... H03H 9/133; H03H 9/568; H03H 9/605
USPC .................................. 333/186–193
See application file for complete search history.

(56) References Cited

U.S. PATENT DOCUMENTS

| | | |
|---|---|---|
| 2012/0188026 A1 | 7/2012 | Yamaji et al. |
| 2012/0274416 A1 | 11/2012 | Hara et al. |
| 2015/0097638 A1* | 4/2015 | Yu .................. H03H 9/605 333/189 |
| 2016/0359470 A1 | 12/2016 | Kuwahara et al. |
| 2016/0380616 A1 | 12/2016 | Takamine |

FOREIGN PATENT DOCUMENTS

| | | |
|---|---|---|
| JP | 5723667 B2 | 5/2015 |
| JP | 2021-150893 A | 9/2021 |

OTHER PUBLICATIONS

Korean Office Action Issued on Apr. 29, 2025, in Counterpart Korean Patent Application No. 10-2023-0047622 (3 Pages in English, 4 Pages in Korean).

Korean Office Action issued on Aug. 26, 2024, in counterpart Korean Patent Application No. 10-2023-0047622 (4 pages in English, 4 pages in Korean).

* cited by examiner

*Primary Examiner* — Rakesh B Patel
(74) *Attorney, Agent, or Firm* — NSIP Law (57) ABSTRACT An acoustic wave filter is provided. The acoustic wave filter includes a first resonator connected between a first port and a second port, a second resonator which has a first end connected to the first port, a third resonator which has a first end connected to the second port, and a fourth resonator connected between a ground and a first node to which a second end of the second resonator and a second end of the third resonator are connected to each other.

6 Claims, 7 Drawing Sheets

ACOUSTIC WAVE FILTER

CROSS-REFERENCE TO RELATED APPLICATIONS

This application claims the benefit under 35 USC § 119(a) of Korean Patent Application No. 10-2023-0047622, filed on Apr. 11, 2023, in the Korean Intellectual Property Office the entire disclosure of which is incorporated herein by reference for all purposes.

BACKGROUND

1. Field

The following description relates to an acoustic wave filter.

2. Description of the Background

With the rapid development of mobile communication devices, chemical devices, bio devices, and the like, the demand for small lightweight filters, oscillators, resonance elements, acoustic resonant mass sensors, and the like, that are implemented in these devices, has increased.

Acoustic resonators such as bulk acoustic wave (BAW) filters may be used to implement such small lightweight filters, oscillators, resonance elements, acoustic resonant mass sensors, etc. Since the acoustic resonator is very small in size and has good performance (e.g., a wide pass bandwidth) compared with a dielectric filter, a metal cavity filter, a wave guide, and the like, it is widely implemented in communication modules of mobile devices in which good and stable performance is desired.

A long term evolution (LTE) Band 30 is part of the frequency division duplex (FDD) LTE spectrum, and the uplink frequency band (2305-2315 MHZ) and downlink frequency band (2350-2360 MHZ) are different, and the width of the two bands is 10 MHz each, which is very narrow. Additionally, since the interval between the uplink frequency band and the downlink frequency band is only 45 MHZ, a small effective electromechanical coupling factor ($kt^2$) of the resonator and excellent skirt characteristics may be desirous to implement it as a single module.

However, in order to implement a small $kt^2$ in a process, the thickness of the piezoelectric layer should be reduced. Since the reduction of the thickness of the piezoelectric layer may cause an increase in the driving frequency of the resonator, it may be difficult to obtain a sufficiently small $kt^2$ in a desired frequency band.

The above information is presented as background information only to assist with an understanding of the present disclosure. No determination has been made, and no assertion is made, as to whether any of the above might be applicable as prior art with regard to the disclosure.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, an acoustic wave filter includes a first resonator connected between a first port and a second port; a second resonator which has a first end connected to the first port; a third resonator which has a first end connected to the second port; and a fourth resonator connected between a ground and a first node to which a second end of the second resonator and a second end of the third resonator are connected to each other.

A resonance frequency of the fourth resonator may be equal to a resonance frequency of the first resonator.

A first active area where resonance of the first resonator occurs and a second active area where resonance of the second resonator and the third resonator occur may not overlap each other.

The acoustic wave filter may be a bulk acoustic wave filter.

In a general aspect, an acoustic wave filter includes a series resonator connected between a first port and a second port; a first shunt resonator having a first end connected to a first end of the series resonator; a second shunt resonator having a first end connected to a second end of the series resonator, and a second end connected to a second end of the first shunt resonator at a node; and a fourth resonator connected between the node and ground.

A resonance frequency of the series resonator may be equal to a resonance frequency of the fourth resonator.

A resonance frequency of the first shunt resonator may be equal to a resonance frequency of the second shunt resonator, and a band between the resonance frequency of the first shunt resonator and an anti-resonance frequency of the first shunt resonator does not overlap with a band between the resonance frequency of the fourth resonator and an anti-resonance frequency of the fourth resonator.

In a general aspect, an acoustic wave filter includes a first resonator connected in series between a first port and a second port; a first shunt resonator connected to the first resonator, the first port, and a common node; a second shunt resonator connected to the first resonator, the second port, and the common node; and a fourth resonator connected between the common node and a ground, wherein a resonance frequency of the first resonator is equal to a resonance frequency of the fourth resonator.

A resonance frequency of the first resonator may be greater than a resonance frequency of the first shunt resonator and a resonance frequency of the second shunt resonator.

Other features and aspects will be apparent from the following detailed description, the drawings, and the claims.

Throughout the drawings and the detailed description, unless otherwise described, the same reference numerals refer to the same elements. The drawings may not be to scale, and the relative size, proportions, and depiction of elements in the drawings may be exaggerated for clarity, illustration, and convenience.

DETAILED DESCRIPTION

Hereinafter, while examples of the present disclosure will be described in detail with reference to the accompanying drawings, it is noted that examples are not limited to the same.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of this disclosure. For example, the sequences of operations described herein are merely examples, and are not limited to those set forth herein, but may be changed as will be apparent after an understanding of this disclosure, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of this disclosure.

Throughout the specification, when an element, such as a layer, region, or substrate is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items; likewise, "at least one of" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms, such as "above," "upper," "below," "lower," and the like, may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above," or "upper" relative to another element would then be "below," or "lower" relative to the other element. Thus, the term "above" encompasses both the above and below orientations depending on the spatial orientation of the device. The device may also be oriented in other ways (rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

Herein, it is noted that use of the term "may" with respect to an example, for example, as to what an example may include or implement, means that at least one example exists in which such a feature is included or implemented while all examples are not limited thereto.

The features of the examples described herein may be combined in various ways as will be apparent after an understanding of this disclosure. Further, although the examples described herein have a variety of configurations, other configurations are possible as will be apparent after an understanding of this disclosure.

Throughout the specification, the RF signal may have a format according to other random wireless and wired protocols designated by, as only examples, Wi-Fi (IEEE 802.11 family, etc.), WiMAX (IEEE 802.16 family, etc.), IEEE 802.20, long term evolution (LTE), Evolution-Data Optimized (Ev-DO), high-speed packet access plus (HSPA+), high-speed downlink packet access plus (HSDPA+), high-speed uplink packet access plus (HSUPA+), Enhanced Data GSM Evolution (EDGE), Global System for Mobile communication (GSM), Global Positioning System (GPS), General Packet Radio Service (GPRS), Code Division Multiple Access (CDMA), Time Division Multiple Access (TDMA), digital enhanced cordless communication (DECT), Bluetooth, third generation (3G), fourth generation (4G), fifth generation (5G), and any other wireless and wired protocols designated thereafter, but is not limited thereto.

One or more examples may provide an acoustic wave filter that improves $kt^2$ characteristics and skirt characteristics in a desired frequency band.

Figure 1:
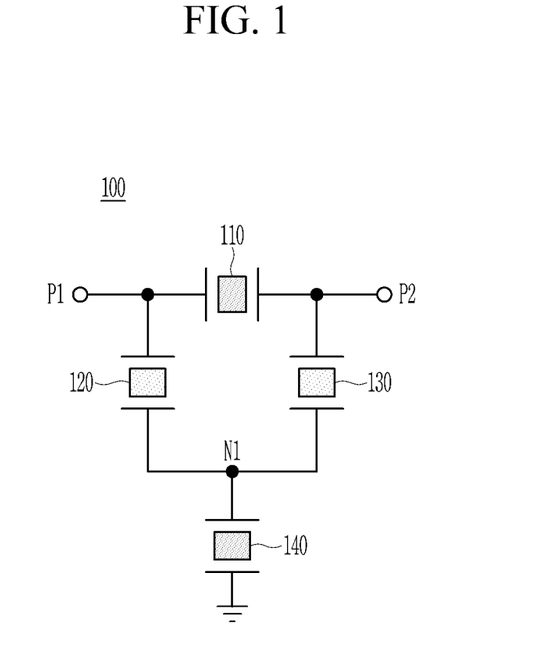
FIG. 1 is a circuit diagram illustrating an example acoustic wave filter, in accordance with one or more embodiments.

FIG. 1 is a circuit diagram illustrating an example acoustic wave filter, in accordance with one or more embodiments.

Referring to FIG. 1, the example acoustic wave filter 100, in accordance with one or more embodiments, may pass a signal of a main frequency band in an input RF signal. The acoustic wave filter 100 may pass the signal of the main frequency band from the RF signal input through the port P1 and output the signal of the main frequency band to the port P2.

The acoustic wave filter 100 may include a resonator 110, a resonator 120, a resonator 130, and a resonator 140.

The resonator 110 may be connected in series between the port P1 and the port P2. Since the resonator 110 may be serially connected between the port P1 and the port P2, the resonator 110 may be a series resonator 110.

One end of the resonator 120 may be connected to any one node between the port P1 and the node N1. For example, a first end of the resonator 120 may be connected to a node between the port P1 and the port P2, and a second end of the resonator 120 may be connected to the node N1.

One end of the resonator 130 may be connected to any one node between the port P2 and the node N1. For example, a first end of the resonator 130 may be connected to a node between the port P1 and the port P2, and a second end of the resonator 130 may be connected to the node N1.

The second end of the resonator 120 may be connected to the second end of the resonator 130 through the node N1. That is, the second end of the resonator 120 and the second end of the resonator 130 may be commonly connected to the node N1.

The resonator 140 may be connected between the node N1 and the ground. In an example, the resonance frequency of the resonator 140 may be set to be the same as the resonance frequency of the resonator 110.

Since the resonator 120 may be connected between the port P1 and the ground, and the resonator 130 is connected between the port P2 and the ground, the resonator 120 and the resonator 130 may be shunt resonators.

In the resonators 110, 120, 130, and 140, resonance may occur in a frequency band between a resonance point and an anti-resonance point of each resonator. In the resonators 110, 120, 130, and 140, resonance does not occur in a frequency band other than a frequency band between a resonance point and an anti-resonance point of each resonator. The frequency of the resonance point is called the resonance frequency, and the frequency of the anti-resonance point is called the anti-resonance frequency. Additionally, a frequency band in which resonance occurs is referred to as an active area, and a frequency band in which resonance does not occur is referred to as an inactive area.

As the frequency of the RF signal is closer to the resonance frequency of the resonator 110, the transmission rate of the RF signal between the port P1 and the port P2 increases, and as the frequency of the RF signal is closer to the anti-resonance frequency of the resonator 120, the transmission rate of the RF signal between the ports P1 and P2 decreases.

Additionally, as the frequency of the RF signal is closer to the resonance frequencies of the resonators 120 and 130, the transmission rate of the RF signal between the port P1 and the ground and the transmission rate between the port P2 and the ground increase, and as the increases in frequencies of the RF signal is closer to the anti-resonance frequency of the resonators 120 and 130, the transmission rate of the RF signal between the port P1 and the ground and the transmission rate between the port P2 and the ground decrease.

In the acoustic wave filter 100, the resonators 120, 130, and 140 may have resonance points and anti-resonance points, respectively, so that the active areas of the resonator 140 do not overlap with the active areas of the resonators 120 and 130.

Additionally, the resonance frequency of the resonator 110 may be set higher than the resonance frequencies of the resonators 120 and 130, and since the anti-resonance frequency is higher than the resonance frequency, the acoustic wave filter 100 may have a pass bandwidth formed by the lowest frequency corresponding to the resonance frequencies of the resonators 120 and 130 and the highest frequency corresponding to the anti-resonance frequency of the resonator 110. The pass bandwidth may be wider as the difference between the resonance frequencies of the resonators 120 and 130 and the anti-resonance frequency of the resonator 110 increases. However, if the difference is too large, the pass bandwidth may split.

In the acoustic wave filter 100, the resonators 110, 120, 130, and 140 may have piezoelectric properties. In an example, the acoustic wave filter 100 may be a bulk acoustic wave (BAW) filter.

FIG. 1 illustrates the structure of a basic ladder filter including one resonator 110 corresponding to a series resonator and two resonators 120 and 130 corresponding to shunt resonators. However, in an example, a plurality of resonators may be connected in series between ports P1 and P2, a plurality of resonators may be connected between different nodes between the port P1 and the resonator 110 and the ground, and a plurality of resonators may be connected between different nodes between the resonator 110 and the port P2 and the ground. Additionally, in an example, several basic ladder filters may be connected in series. In this example, in one basic ladder filter structure, the other ends (or the second ends) of two or more resonators corresponding to shunt resonators may be connected to each other through the node N1, and the resonator 140 may be connected in series between the node N1 and the ground.

In the acoustic wave filter 100, a difference between a resonance frequency and an anti-resonance frequency of a resonator may be determined based on an electromechanical coupling factor $kt^2$ representing physical characteristics of the resonator. When the size or shape of the resonator is changed, the resonance frequency and the anti-resonance frequency may be changed together. That is, when $kt^2$ of the resonator is changed, the difference between the resonance frequency and the anti-resonance frequency may also be changed. In other words, $kt^2$ can be changed by changing the difference between the resonance frequency and the anti-resonance frequency.

Figure 2:
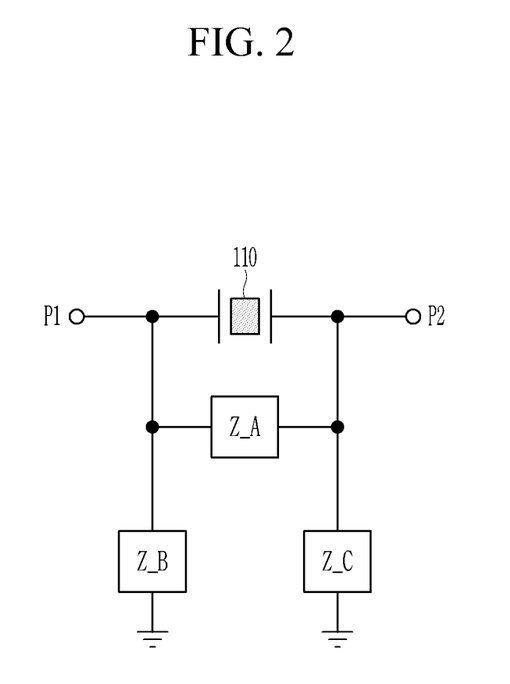
FIG. 2 is a diagram illustrating an example equivalent circuit of the example acoustic wave filter shown in FIG. 1.

The circuit of the acoustic wave filter shown in FIG. 1 can be expressed as the equivalent circuit shown in FIG. 2 by wye-delta (Y-Δ) transformation.

Figure 3:
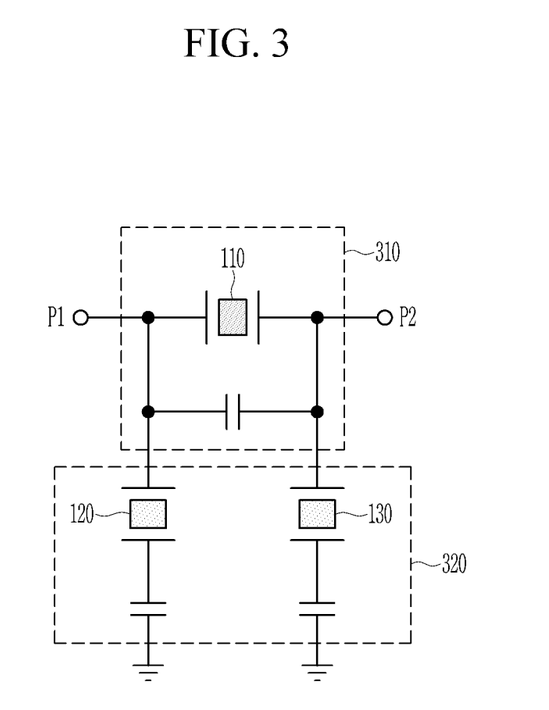
FIG. 3 is a circuit diagram of an example acoustic wave filter according to the equivalent circuit analysis of FIG. 2 when each resonator operates in an active area.

FIG. 2 is a diagram showing an example of an equivalent circuit of the acoustic wave filter shown in FIG. 1, and FIG. 3 is a circuit diagram of an acoustic wave filter according to the equivalent circuit analysis of FIG. 2 when each resonator operates in an active area.

Referring to FIG. 2 and FIG. 3, in the acoustic wave filter 100, the Y circuit may include a resonator 120, a resonator 130, and a resonator 140.

In the acoustic wave filter 100, the Y circuit can be equivalently converted into a delta Δ circuit consisting of an impedance Z_A connected in parallel to resonator 110, an impedance Z_B connected between port P1 and ground and an impedance Z_C connected between port P2 and ground by wye-delta Y-Δ transformation.

By the wye-delta Y-Δ transformation, impedance Z_A, impedance Z_B, and impedance Z_C can be expressed by formulas.

According to one embodiment, the impedance Z_A, impedance Z_B, and impedance Z_C can be briefly expressed by dividing an example in which the resonator 140 operates in an active area and an example in which the resonators 120 and 130 operate in active areas, can be briefly expressed.

In the Y circuit, in the active area where the resonator 140 resonates, which is a frequency band between the resonance point and the anti-resonance point of the resonator 140, the resonators 120 and 130 operate as capacitors, the resonator 120 may have a capacitance C_a, and the resonator 130 can be expressed as a capacitance C_b. Therefore, the impedance Z_A in the active area where the resonator 140 resonates can be expressed as in Equation 1 by wye-delta Y-Δ transformation.

$$Z\_A = C\_a + C\_b + C\_a * C\_b / RES\_c \qquad \text{Equation 1}$$

In Equation 1, RES_c represents the impedance of the resonator 140.

As a result, in the frequency band of the active area where the resonators 110 and 140 resonate, the acoustic wave filter 100 operates like a circuit in which a capacitor is connected in parallel to the resonator 110 as shown in part 310 of FIG. 3.

In an example, in the Y circuit, in an active area where the resonators 120 and 130 resonate, which is a frequency band between the resonance point and the anti-resonance point of the resonators 120 and 130, the resonator 140 operates as a capacitor, and the resonator 140 may be expressed as capacitance C_c. Therefore, the impedance Z_B in the active area where the resonators 120 and 130 resonate can be expressed as in Equation 2 by wye-delta Y-Δ transformation.

$$Z\_B = Kb * C\_c + RES\_a \qquad \text{Equation 2}$$

In Equation 2, RES_a represents the impedance of the resonator 120. Also, Kb represents (Res_a+Res_b)/Res_b.

Additionally, the impedance Z_C in the active area where the resonators 120 and 130 resonate can be expressed as in Equation 3 by wye-delta Y-Δ transformation.

$$Z\_C = Ka * C\_c + RES\_b \qquad \text{Equation 3}$$

In Equation 3, RES_b represents the impedance of the resonator 130. Additionally, Ka represents (Res_a+Res_b)/Res_a.

As a result, in the frequency band of the active areas where the resonators 120 and 130 resonate, the acoustic wave filter 100 operates like a circuit in which capacitors are connected in series to the resonators 120 and 130, respectively, as shown in part 320 of FIG. 3.

Figure 4:
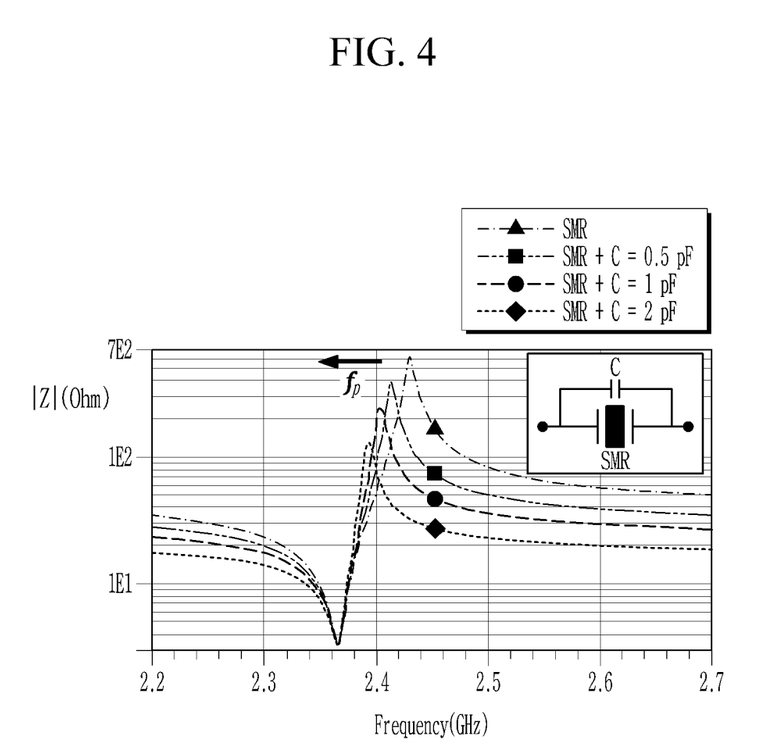
FIG. 4 is a graph illustrating a change in characteristics of an example resonator when a capacitor is connected in parallel to the resonator as shown in the portion 310 of FIG. 3.

FIG. 4 is a graph illustrating a change in characteristics of a resonator when a capacitor is connected in parallel with the resonator as shown in the portion 310 of FIG. 3. In FIG. 4, the horizontal axis represents frequency (GHz), and the vertical axis represents impedance (|Z|).

Referring to FIG. 4, when a resonator and a capacitor are connected in parallel, the anti-resonance frequency $f_p$ of the resonator moves to the left. Additionally, as the capacitance of the capacitor increases, the anti-resonance frequency $f_p$ of the resonator shifts more to the left.

Accordingly, when the resonator and the capacitor are connected in parallel, the difference between the resonance frequency and the anti-resonance frequency of the resonator may be reduced, which has the same effect as reducing $kt^2$ of the resonator.

Figure 5:
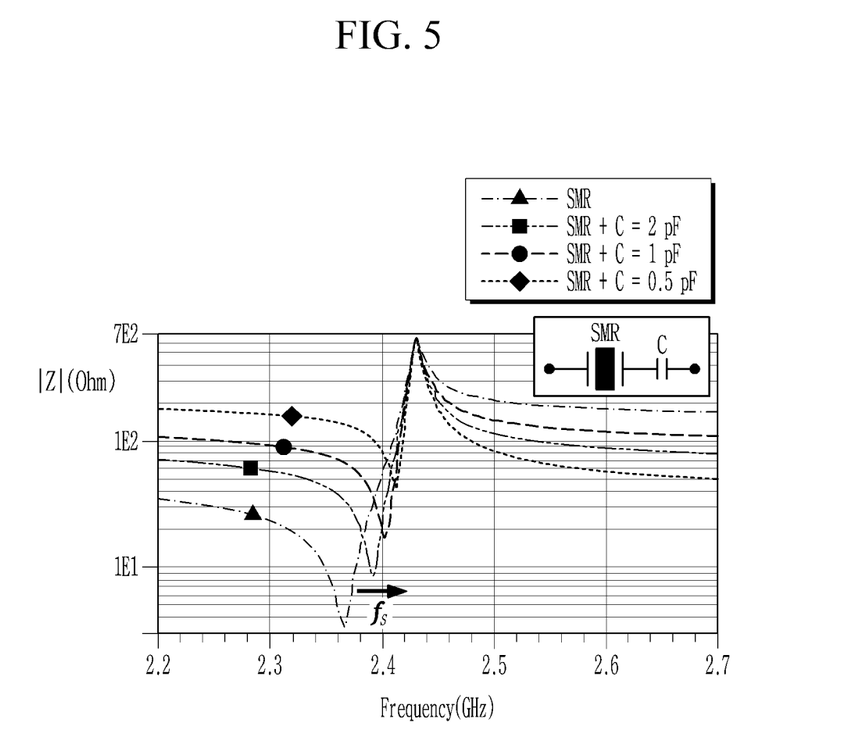
FIG. 5 is a graph illustrating a change in characteristics of a resonator when a capacitor is serially connected to the resonator, as in the portion 320 of FIG. 3.

FIG. 5 is a graph showing a change in characteristics of a resonator when a capacitor is serially connected to the resonator, as in the portion 320 of FIG. 3. In FIG. 5, the horizontal axis represents frequency (GHz), and the vertical axis represents impedance (|Z|).

Referring to FIG. 5, when a resonator and a capacitor are connected in series, the resonant frequency fs of the resonator moves to the right. Additionally, as the capacitance of the capacitor decreases, the resonant frequency fs of the resonator shifts more to the right.

Accordingly, when the resonator and the capacitor are connected in series, the difference between the resonance frequency and the anti-resonance frequency of the resonator may be reduced, which has the same effect as reducing $kt^2$ of the resonator.

The effects of the acoustic wave filter 100 shown in FIG. 1 will be described in detail based on the simulation results shown in FIG. 6.

Figure 6:
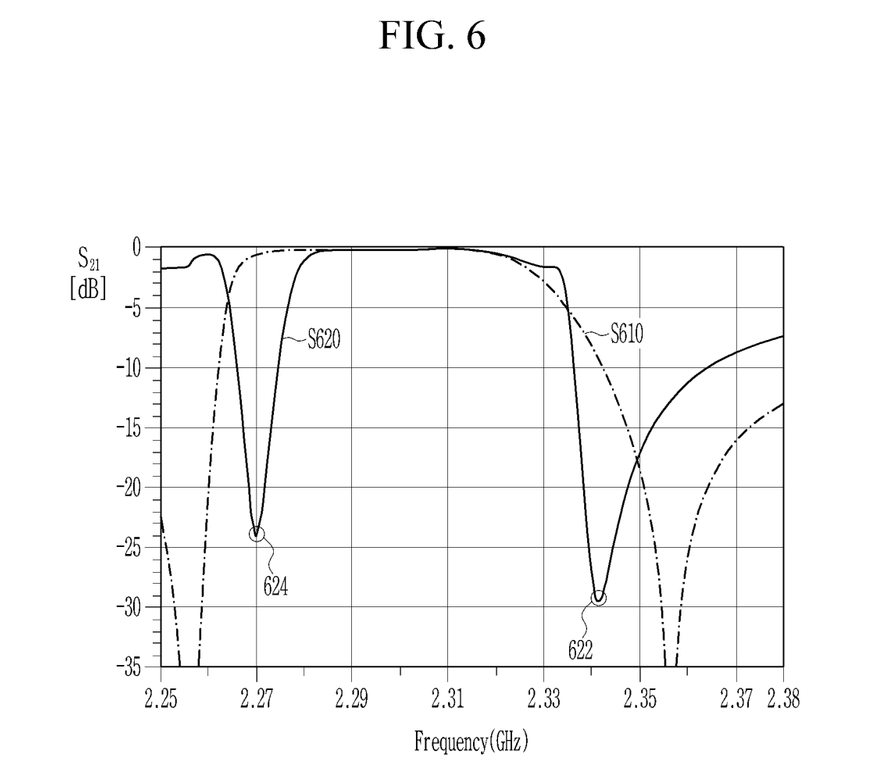
FIG. 6 is a diagram illustrating simulation results of insertion loss of the acoustic wave filter of the embodiment illustrated in FIG. 1 and the acoustic wave filter of a comparative example.

FIG. 6 is a diagram showing simulation results of insertion loss of the acoustic wave filter of the embodiment shown in FIG. 1 and the acoustic wave filter of a comparative example.

Figure 7:
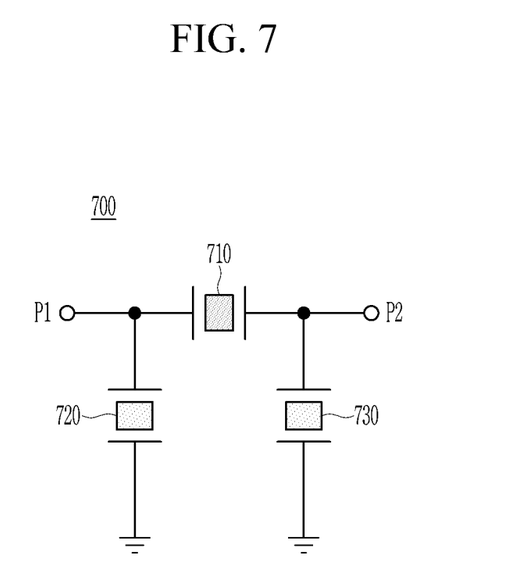
FIG. 7 is a circuit diagram illustrating an acoustic wave filter of a comparative example.

In FIG. 6, a comparative example (S610) is a ladder filter having the structure shown in FIG. 7.

FIG. 7 is a circuit diagram showing an acoustic wave filter of a comparative example.

As illustrated in FIG. 7, the acoustic wave filter 700 of the comparative example (S610) includes a resonator 710 connected between the port P1 and the port P2, a resonator 720 connected between the port P1 and the ground, and a resonator 730 connected between the port P2 and the ground. The resonator 710 may be a series resonator, and the resonator 720 and the resonator 730 may be shunt resonators.

Compared to the acoustic wave filter 100 of FIG. 1, the acoustic wave filter 700 of the comparative example (S610) has no resonator 140.

Referring to FIG. 6, the acoustic wave filter 100 of the example embodiment S620 shown in FIG. 1 has an anti-resonance point 622 on the left side compared to the acoustic wave filter 700 of the comparative example S610 shown in FIG. 7, and has a resonance point 624 on the right side compared to the acoustic wave filter 700 of the comparative example S610 shown in FIG. 7.

That is, when the resonator 110 and the resonator 120 operate in the active area, the acoustic wave filter 100 of the example embodiment (S620) shown in FIG. 1 operates like a circuit in which a capacitor is connected in parallel to the resonator 110 as shown in part 310 of FIG. 3. Therefore, the anti-resonance point 622 may be generated on the left side compared to the acoustic wave filter 700 of the comparative example S610 shown in FIG. 7.

Additionally, when the resonator 120 and the resonator 130 operate in an active area, the acoustic wave filter 100 of the example embodiment (S620) shown in FIG. 1 operates like a circuit in which capacitors are connected in series to the resonators 120 and 130, respectively, as shown in part 320 of FIG. 3. Therefore, a resonance point 624 may be generated on the right side compared to the acoustic wave filter 700 of the comparative example S610 shown in FIG. 7.

Accordingly, the acoustic wave filter 100 of the example embodiment (S620) shown in FIG. 1 may have a narrower bandwidth than the acoustic wave filter 700 of the comparative example (S610) shown in FIG. 7, and may obtain an effect of reducing $kt^2$ without reducing the thickness of the piezoelectric layer.

According to at least one embodiment of the example embodiments, as the other (or second) ends of the two shunt resonators, each having one end connected to both ends of the series resonator, are connected to each other through a node and the resonator is connected between the node and the ground, a sufficiently low $kt^2$ and excellent skirt characteristics can be provided in a band (e.g., 2305 to 2360 MHZ).

Additionally, according to at least one embodiment of the example embodiments, it is possible to implement a small $kt^2$ characteristic, which is difficult to implement due to physical limitations in the process of the resonator, from a circuit design point of view.

While specific examples have been shown and described above, it will be apparent after an understanding of this disclosure that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An acoustic wave filter, comprising:
a first resonator connected between a first port and a second port;
a second resonator which has a first end connected to the first port;
a third resonator which has a first end connected to the second port; and
a fourth resonator connected between a ground and a first node to which a second end of the second resonator and a second end of the third resonator are connected to each other,
wherein a resonance frequency of the fourth resonator is equal to a resonance frequency of the first resonator.

2. The acoustic wave filter of claim 1, wherein:
the acoustic wave filter is a bulk acoustic wave filter.

3. The acoustic wave filter of claim 1, wherein:
a first active area where resonance of the first resonator occurs and a second active area where resonance of the second resonator and the third resonator occurs do not overlap each other.

4. An acoustic wave filter, comprising:
a series resonator connected between a first port and a second port;
a first shunt resonator having a first end connected to a first end of the series resonator;
a second shunt resonator having a first end connected to a second end of the series resonator, and a second end connected to a second end of the first shunt resonator at a node; and
a fourth resonator connected between the node and ground,
wherein a resonance frequency of the first shunt resonator is equal to a resonance frequency of the second shunt resonator, and
wherein a band between the resonance frequency of the first shunt resonator and an anti-resonance frequency of the first shunt resonator does not overlap with a band between the resonance frequency of the fourth resonator and an anti-resonance frequency of the fourth resonator.

5. An acoustic wave filter, comprising:
a first resonator connected in series between a first port and a second port;
a first shunt resonator connected to the first resonator, the first port, and a common node;
a second shunt resonator connected to the first resonator, the second port, and the common node; and
a fourth resonator connected between the common node and a ground,
wherein a resonance frequency of the first resonator is equal to a resonance frequency of the fourth resonator.

6. The acoustic wave filter of claim 5, wherein the resonance frequency of the first resonator is greater than a resonance frequency of the first shunt resonator and a resonance frequency of the second shunt resonator.

* * * * *